(12) United States Patent
Mitsuhashi

(10) Patent No.: US 10,539,627 B2
(45) Date of Patent: Jan. 21, 2020

(54) METHOD OF RESTORING SECONDARY BATTERY AND METHOD OF REUSING SECONDARY BATTERY

(71) Applicant: TOYOTA JIDOSHA KABUSHIKI KAISHA, Toyota-shi, Aichi (JP)

(72) Inventor: Toshihiko Mitsuhashi, Nagoya (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/695,193

(22) Filed: Sep. 5, 2017

(65) Prior Publication Data

US 2018/0067168 A1 Mar. 8, 2018

(30) Foreign Application Priority Data

Sep. 7, 2016 (JP) .................. 2016-174620

(51) Int. Cl.
| | | |
|---|---|---|
| *G01R 31/388* | (2019.01) | |
| *H01M 10/48* | (2006.01) | |
| *H02J 7/04* | (2006.01) | |
| *H02J 7/00* | (2006.01) | |
| *G01R 31/389* | (2019.01) | |

(Continued)

(52) U.S. Cl.
CPC ......... *G01R 31/388* (2019.01); *G01R 31/389* (2019.01); *H01M 10/48* (2013.01); *H01M 10/482* (2013.01); *H02J 7/0075* (2013.01); *H02J 7/042* (2013.01); *G01R 31/3648* (2013.01); *G01R 31/392* (2019.01); *H01M 10/052* (2013.01); *H01M 10/0525* (2013.01); *H01M 10/425* (2013.01); *H01M 10/441* (2013.01); *H01M 10/486* (2013.01); *H01M 2010/4271* (2013.01); *H02J 7/007* (2013.01); *H02J 7/0047* (2013.01); *H02J 7/047* (2013.01); *H02J 2007/005* (2013.01)

(58) Field of Classification Search
CPC ..... H02J 7/042; Y02E 60/122; H01M 10/052; H01M 2010/4271; G01R 31/3679
USPC .......................... 320/134, 132, 136; 324/430
See application file for complete search history.

(56) References Cited

U.S. PATENT DOCUMENTS

| | | | | |
|---|---|---|---|---|
| 7,705,564 B2 * | 4/2010 | Atehortua | ............ | G01R 31/379 320/132 |
| 8,617,745 B2 * | 12/2013 | Gozdz | ................... | H01M 4/133 429/231.9 |

(Continued)

FOREIGN PATENT DOCUMENTS

| | | |
|---|---|---|
| CN | 103827684 A | 5/2014 |
| JP | 2006100000 A | 4/2006 |

(Continued)

*Primary Examiner* — David V Henze-Gongola
*Assistant Examiner* — Tarikh Kanem Rankine
(74) *Attorney, Agent, or Firm* — Sughrue Mion, PLLC

(57) ABSTRACT

A secondary battery restoring method includes a first step of determining whether or not a value of an input-output characteristic of a secondary battery or a battery module is within a predetermined range of reference values, and a second step of adjusting the secondary battery or the battery module to a predetermined low SOC condition of from 0% to 20% SOC and thereafter leaving the secondary battery or the battery module to stand if, in the first step, the value of the input-output characteristic is determined to be outside the predetermined range of reference values.

3 Claims, 4 Drawing Sheets

(51) Int. Cl.
*H01M 10/42* (2006.01)
*G01R 31/392* (2019.01)
*H01M 10/052* (2010.01)
*H01M 10/44* (2006.01)
*G01R 31/36* (2019.01)
*H01M 10/0525* (2010.01)

(56) References Cited

U.S. PATENT DOCUMENTS

| | | | | |
|---|---|---|---|---|
| 8,673,026 | B2 * | 3/2014 | Fujisaki | H01M 2/1061 29/623.1 |
| 9,263,909 | B2 * | 2/2016 | Obata | H01M 10/44 |
| 2009/0284226 | A1 | 11/2009 | Komori et al. | |
| 2010/0247988 | A1 * | 9/2010 | Okumura | B60L 50/16 429/90 |
| 2011/0301891 | A1 * | 12/2011 | Kim | B60L 3/0046 702/63 |
| 2013/0158914 | A1 * | 6/2013 | Chen | G01R 31/3842 702/63 |
| 2013/0307334 | A1 * | 11/2013 | Middleton | H02J 7/0077 307/31 |
| 2015/0004443 | A1 | 1/2015 | Iwase | |

FOREIGN PATENT DOCUMENTS

| | | | |
|---|---|---|---|
| JP | 2009277627 A | 11/2009 | |
| JP | 2011257314 A | 12/2011 | |
| JP | 2011257372 A | 12/2011 | |
| JP | 201228024 A | 2/2012 | |
| JP | 201238463 A | 2/2012 | |
| JP | 201319709 A | 1/2013 | |
| JP | 2016-131076 A | 7/2016 | |
| WO | 2011132300 A1 | 10/2011 | |
| WO | WO-2013046263 A1 * | 4/2013 | ............ H01M 10/44 |
| WO | 2013111186 A1 | 8/2013 | |

* cited by examiner

METHOD OF RESTORING SECONDARY BATTERY AND METHOD OF REUSING SECONDARY BATTERY

CROSS REFERENCE TO RELATED APPLICATIONS

This application claims the benefit of priority to Japanese Patent Application No. 2016-174620 filed on Sep. 7, 2016. The entire contents of this application are hereby incorporated herein by reference.

BACKGROUND OF THE INVENTION

1. Field of the Invention

The present invention relates to a secondary battery restoring method and a secondary battery reusing method.

2. Description of the Related Art

JP 2016-131076 A, for example, discloses a method of judging whether or not a battery module is reusable. Therein, it is determined whether or not a battery module can be separated into a plurality of secondary batteries, which constitute the battery module, through a step of determining whether a battery characteristic value is within an acceptable range, and a step of measuring a compression load of the battery module and determining whether the compression load is equal to or less than a predetermined threshold value.

SUMMARY OF THE INVENTION

An embodiment of the secondary battery restoring method proposed herein includes the following first and second steps.

The first step is a step of determining whether or not a value of an input-output characteristic of a secondary battery or a battery module is within a predetermined range of reference values.

The second step is a step of adjusting the secondary battery or the battery module to a predetermined low SOC condition of from 0% to 20% SOC and thereafter leaving the secondary battery or the battery to stand for a predetermined time period if, in the first step, the value of the input-output characteristic is determined to be outside the predetermined range of reference values.

According to the just-described restoring method, the secondary battery or the battery module whose input-output characteristic has been determined to be outside the predetermined range of reference values in the first step is adjusted to a low SOC condition and thereafter left to stand for a predetermined time period. This enables the secondary battery or the battery module to be restored more quickly than in the case where the secondary battery or the battery module is not adjusted to be in a low SOC condition.

An embodiment of the secondary battery reusing method proposed herein includes the following first to fifth steps.

The first step is a step of determining whether or not a value of an input-output characteristic of a secondary battery or a battery module is within a predetermined range of reference values.

The second step is a step of adjusting the secondary battery or the battery module to a predetermined low SOC condition of from 0% to 20% SOC and thereafter leaving the secondary battery or the battery to stand for a predetermined time period if, in the first step, the value of the input-output characteristic is determined to be outside the predetermined range of reference values.

The third step is a step of, subsequent to the second step, determining whether or not the value of the input-output characteristic is within the predetermined range of reference values.

The fourth step is a step of determining the secondary battery or the battery module to be unusable if, in the third step, the value of the input-output characteristic is determined to be outside the predetermined range of reference values.

The fifth step is a step of determining the secondary battery or the battery module to be usable if, in the first step or in the third step, the value of the input-output characteristic is determined to be within the predetermined range of reference values.

This reusing method makes it possible to quickly and appropriately determine whether a secondary battery or a battery module that has caused high-rate deterioration is usable or not. Herein, the term "high-rate deterioration" refers to the performance deterioration of a battery that occurs when the battery is repeatedly charged and discharged at high rate.

Herein, it is also possible that the method may further include a sixth step of adjusting the secondary battery or the battery module to a predetermined SOC if, in the third step, the value of the input-output characteristic is determined to be within the predetermined range of reference values.

It is also possible that the input-output characteristic be resistance. When testing is carried out based on resistance, it is possible to appropriately determine whether secondary battery or a battery module can be restored from a condition of high-rate deterioration, and it is possible to appropriately test whether the secondary battery or the battery module that has caused high-rate deterioration is usable or not.

DETAILED DESCRIPTION OF THE PREFERRED EMBODIMENTS

A battery cell that has undergone repeated charging and discharging at high rate has a tendency to show an increase in battery resistance and deterioration of input-output characteristic. According to the knowledge of the present inventor, such an increase in battery resistance may in some cases result from salt concentration unevenness in the electrolyte solution between the positive electrode sheet and the negative electrode sheet of the secondary battery. For example, with lithium-ion secondary batteries, such an event can occur when the transfer rate of lithium ions in the electrolyte solution cannot catch up with the rate of battery reactions during charging and discharging at high rate. When a resistance increase occurs due to such an event, it is desirable to leave the secondary battery to stand for some time, and as the salt concentration unevenness in the electrolyte solution disappears, the resistance in a secondary battery 10 or a battery module decreases accordingly. Even when the input-output characteristic has deteriorated, however, the input-output characteristic may in some cases be restored if the battery is left to stand for a long time, for example, for 40 hours or longer. Such an increase in battery resistance and deterioration of the input-output characteristic may also, in some cases, be due to deterioration of the battery material such as changes in the crystal structure of the active material and cracks of the active material. In some cases, even when the battery is left to stand for a long time, 40 hours or longer, the input-output characteristic may not be restored sufficiently. For these reasons, in the case where it is possible to restore the input-output characteristic of the secondary battery, it is desired to restore the input-output characteristic quickly. Thus, it is desired to determine whether or not it is possible to restore the input-output characteristic of the secondary battery quickly.

Hereinbelow, embodiments of a secondary battery restoring method and a secondary battery reusing method proposed herein will be described. The embodiments described herein are, of course, not intended to limit the present invention.

Figure 1:
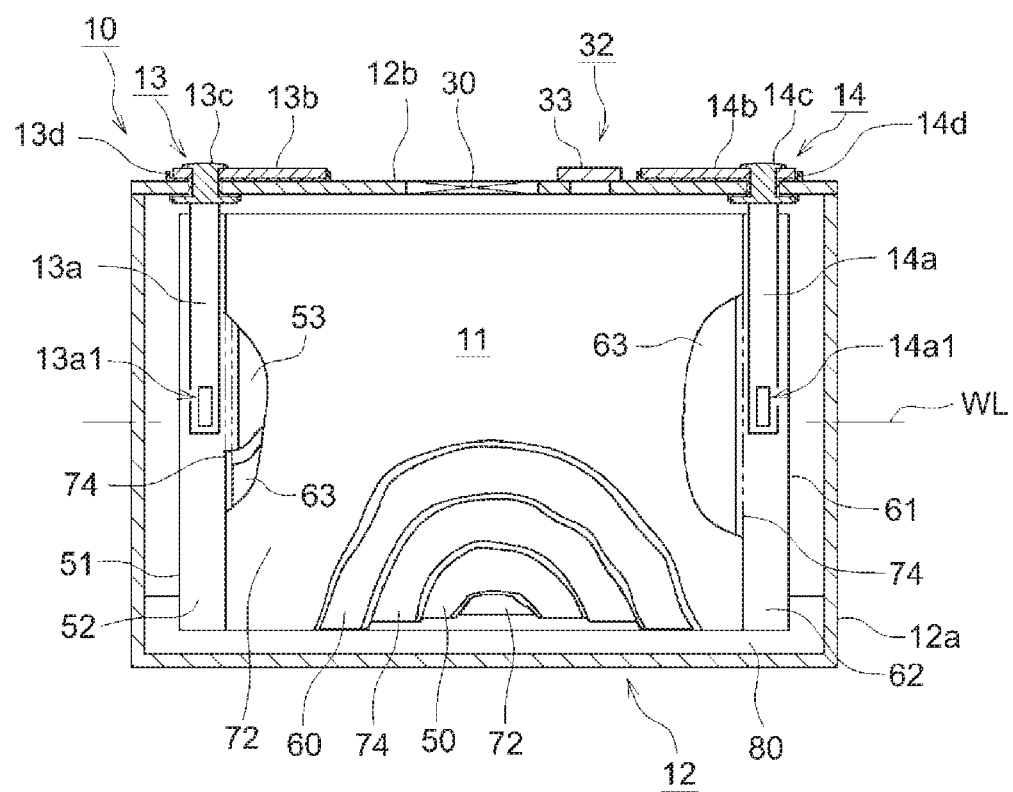
FIG. 1 is a partial cross-sectional view illustrating an example of the structure of a secondary battery.

For example, FIG. 1 is a partial cross-sectional view illustrating an example of the structure of a secondary battery. FIG. 1 shows a prismatic battery in which a wound electrode assembly is accommodated. Herein, a secondary battery 10 includes an electrode assembly 11 and a case 12, as illustrated in FIG. 1. The case 12 includes a case main body 12a, a lid 12b, and electrode terminals 13 and 14.

The electrode assembly 11 includes, for example, a positive electrode sheet 50, a negative electrode sheet 60, and separators 72 and 74. In the structure shown in FIG. 1, the positive electrode sheet 50 has a positive electrode current collector foil 51, and a positive electrode active material layer 53 containing a positive electrode active material. The positive electrode current collector foil 51 is a strip-shaped sheet (for example, an aluminum foil). The positive electrode current collector foil 51 has an exposed portion 52 provided along one lateral-side edge thereof. The positive electrode active material layer 53 is formed on both faces of the positive electrode current collector foil 51 except for the exposed portion 52. The negative electrode sheet 60 has a negative electrode current collector foil 61, and a negative electrode active material layer 63 containing a negative electrode active material. The negative electrode current collector foil 61 is a strip-shaped sheet (for example, a copper foil). The negative electrode current collector foil 61 has an exposed portion 62 provided along one lateral-side edge thereof. The negative electrode active material layer 63 is formed on both faces of the negative electrode current collector foil 61 except for the exposed portion 62.

The positive electrode sheet 50 and the negative electrode sheet 60 are stacked so that their longitudinal orientations are aligned with each other and the positive electrode active material layer 53 and the negative electrode active material layer 63 face each other with the separators 72 and 74 interposed therebetween. In this case, the positive electrode sheet 50 and the negative electrode sheet 60 are stacked so that the exposed portion 52 of the positive electrode current collector foil 51 protrudes from one lateral-side edge of each of the separators 72 and 74 and the exposed portion 62 of the negative electrode current collector foil 61 protrudes from the opposite lateral-side edge of each of the separators 72 and 74. In such a stacked state, the positive electrode sheet 50, the negative electrode sheet 60, and the separators 72 and 74 are wound together around a winding axis WL, which is set along a shorter side edge of the positive electrode sheet 50. At one side edge of the electrode assembly 11 along the winding axis WL, the exposed portion 52 of the positive electrode current collector foil 51 protrudes from the separators 72 and 74. At the other side edge, the exposed portion 62 of the negative electrode current collector foil 61 protrudes from the separators 72 and 74. Each of the separators 72 and 74 may be a porous sheet that permits the electrolyte solution to pass through but is capable of insulating the positive electrode sheet 53 and the negative electrode sheet 63 from each other.

The case main body 12a is a member for accommodating the electrode assembly 11. In the embodiment shown in FIG. 1, the case main body 12a has a closed-bottom rectangular parallelepiped shape one side face of which is open. The lid 12b is a member attached to the side face that is open, for closing the opening of the case main body 12a. The lid 12b is welded to the peripheral edge of the opening of the case main body 12a. The case main body 12a and the lid 12b may preferably be made of a lightweight metal material having appropriate strength, such as aluminum, aluminum alloys, and steels (SUS materials).

The electrode terminals 13 and 14 are provided at opposite longitudinal-side end portions of the lid 12b. The electrode terminals 13 and 14 include respective internal terminals 13a and 14a, which are disposed inside the case 12, and respective external terminals 13b and 14b, which are disposed outside the case 12. The internal terminals 13a and 14a and the external terminals 13b and 14b clamp the lid 12b respectively from the inside and the outside of the lid 12b with insulative gaskets 13d and 14d interposed therebetween. The internal terminals 13a and 14a and the external terminals 13b and 14b are fixed to the lid 12b by clamp members 13c and 14c. The internal terminals 13a and 14a and the external terminals 13b and 14b are electrically connected to each other. The exposed portion 52 of the positive electrode current collector foil 51 is welded to a tip portion 13a1 of the internal terminal 13a of the positive electrode. The exposed portion 62 of the negative electrode current collector foil 61 is welded to a tip portion 14a1 of the internal terminal 14a of the negative electrode.

The case main body 12a is a prismatic case having a flat rectangular retaining region. The wound electrode assembly 11 is enclosed in the case main body 12a so as to be in a flat shape along a plane containing the winding axis WL. After the electrode assembly 11 is enclosed therein, the lid 12b is attached to the case main body 12a. An insulating film (not shown) is interposed between the electrode assembly 11 and the case main body 12a and between electrode assembly 11 and the lid 12b, so that the case main body 12a and the lid 12b are insulated from the electrode assembly 11. The lid 12b is provided with a safety vent 30 and a filling port 32, and a cap 33 is fitted to the filling port 32. An electrolyte solution 80 is filled into the case main body 12a through the filling port 32. The filling port 32 is closed by the cap 33, which is fitted thereto after the electrolyte solution 80 is filled.

Herein, the positive electrode active material and the negative electrode active material of the secondary battery are not limited to any particular material, unless otherwise stated. Examples of the usable positive electrode active material include layered-type or spinel-type lithium-transition metal composite oxides (such as $LiNiO_2$, $LiCoO_2$, $LiFeO_2$, $LiMn_2O_4$, $LiNi_{1/3}Co_{1/3}Mn_{1/3}O_2$, $LiNi_{0.5}Mn_{1.5}O_4$, $LiCrMnO_4$, and $LiFePo_4$). An example of the electrode assembly is a wound electrode assembly. Although the wound electrode assembly is illustrated in a flat shape, the wound electrode assembly may be in a cylindrical shape. It is also possible to employ a stacked-type electrode assembly in which positive electrode sheets and negative electrode sheets are alternately stacked with separators interposed therebetween.

A battery module comprises a plurality of secondary batteries 10 combined in series or in parallel to construct a high-capacity, high-power battery. When the internal resistance of the secondary batteries 10, which constitute a battery module, rises, the resistance of the battery module rises. The resistance components of the secondary batteries 10 include charge transfer resistance between the active material and the electrolyte solution interface, and diffusion resistance of the lithium ions in the active material.

According to the knowledge of the present inventor, an increase in the resistance in the secondary battery 10 or the battery module may be caused, in some cases, in association with deterioration of the material, such as changes in the crystal structure of the active material and cracks in the active material. Such a resistance increase associated with deterioration of the material is not sufficiently restored even when the secondary battery 10 or the battery module is left to stand for a long time.

On the other hand, in the use applications that involve charging and discharging at high rate, a resistance increase in the secondary battery 10 or the battery module may be caused due to occurrence of salt concentration unevenness in the secondary battery 10. In other words, there may be cases where salt concentration unevenness occurs in the electrolyte solution between the positive electrode sheet 50 and the negative electrode sheet 60 of the secondary battery 10. For example, with lithium-ion secondary batteries, such an event can occur when the transfer rate of lithium ions in the electrolyte solution cannot catch up with the rate of battery reactions for charging and discharging at high rate. When a resistance increase occurs due to such an event, it is desirable to leave the secondary battery 10 or the battery module to stand for some time, and as the salt concentration unevenness in the electrolyte solution disappears, the resistance in the secondary battery 10 or the battery module decreases accordingly. However, full restoration requires a long time.

In addition, a shortage of lithium ions necessary for battery reactions, which results from dry-out of the electrolyte solution between the positive electrode sheet 50 and the negative electrode sheet 60, may also be a cause of the resistance increase in the secondary battery 10 or the battery module. For example, expansion and shrinkage of the active material due to charging and discharging at high rate result in fluctuations in the gap between the positive electrode sheet 50 and the negative electrode sheet 60. Then, because of pumping-like effect, the electrolyte solution is extruded from the gap between the positive electrode sheet 50 and the negative electrode sheet 60, which may cause a situation in which the electrolyte solution dries out between the positive electrode sheet 50 and the negative electrode sheet 60. In addition, expansion of the electrolyte solution due to heat generation of the secondary battery 10 may also cause the electrolyte solution to be extruded from the gap between the positive electrode sheet 50 and the negative electrode sheet 60. As a consequence, in the electrode assembly 11 as shown in FIG. 1, for example, the electrolyte solution shortage tends to occur more easily in a central portion along the winding axis WL of the electrode assembly 11 than in both side portions thereof. In the case where such an event causes a resistance increase, when the secondary battery or the battery module is left to stand for some time, the electrolyte solution returns to the gap between the positive electrode sheet 50 and the negative electrode sheet 60 and the electrolyte solution shortage disappears gradually, so the resistance in the secondary battery or the battery module decreases accordingly. In this case as well, full restoration requires a long time.

When the resistance in the secondary battery 10 or the battery module increases in this way, the resistance increase may be improved sufficiently in one case by leaving the secondary battery 10 or the battery module to stand for some time, but in the other case, the resistance increase may not be improved sufficiently by leaving the secondary battery 10 or the battery module to stand for some time. Also, there is a case where restoration of the input-output characteristic of the battery (i.e., a decrease in the battery resistance) takes place slowly even when the secondary battery 10 or the battery module is left to stand for some time, so that it is difficult to judge whether the input-output characteristic of the secondary battery 10 or the battery module improves or not. This means that there is a case where even when the resistance value increases in a certain condition, it is expected that the input-output characteristic may be restored, so it takes a long time (for example, 40 hours or longer (see graph A in FIG. 2)) to determine whether the input-output characteristic can be restored or not. Thus, it is difficult to quickly and appropriately judge whether or not the secondary battery 10 or the battery module needs to be replaced.

The present inventor have newly discovered that, as for secondary batteries whose resistance has increased due to repeated charging and discharging at high rate, the secondary battery 10 or the battery module can be restored more quickly when the secondary battery 10 or the battery module is adjusted to a low SOC condition and thereafter left to stand for some time, as long as the input-output characteristic of the secondary battery 10 or the battery module is expected to be restored.

Figure 2:
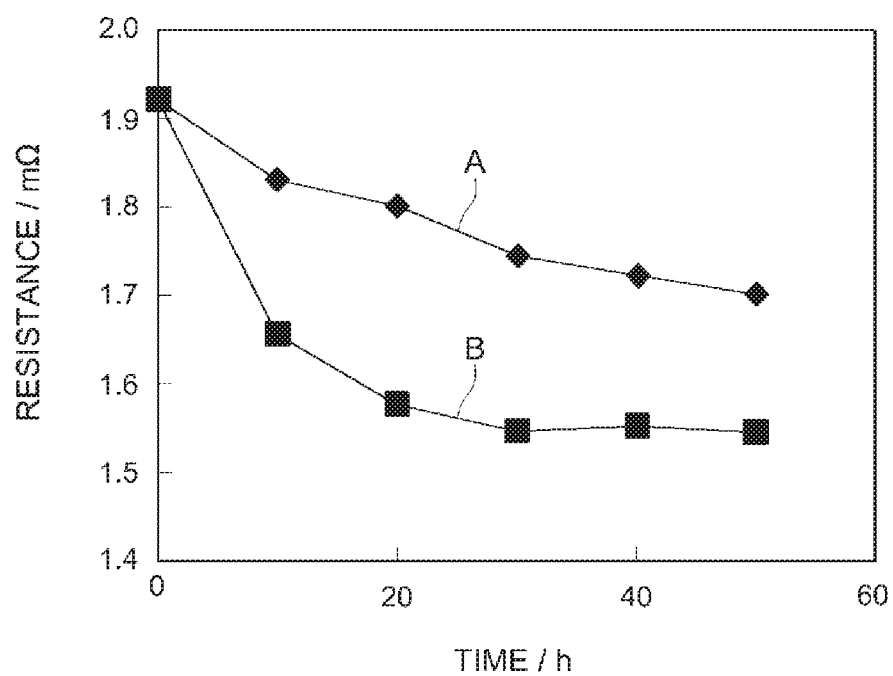
FIG. 2 is a graph illustrating changes in resistance in a secondary battery.

FIG. 2 is a graph illustrating changes in resistance of a secondary battery. In FIG. 2, the vertical axis represents resistance (mΩ). The horizontal axis represents time (h). FIG. 2 illustrates, for a secondary battery whose resistance has increased due to repeated charging and discharging at high rate, the changes in resistance in the secondary battery as the secondary battery is left to stand. The graph A represents changes in the resistance value for a secondary battery when the secondary battery is adjusted to a high SOC (herein, 85% SOC) and thereafter left to stand. The graph B represents changes in the resistance value for a secondary battery when the secondary battery is adjusted to a low SOC (herein, 5% SOC) and thereafter left to stand.

The samples of the secondary battery shown in the graphs shown in FIG. 2 has the following structure.

The positive electrode active material layer contains $LiNi_{1/3}Co_{1/3}Mn_{1/3}O_2$ as the positive electrode active material, carbon black as the positive electrode conductive agent, and polyvinylidene difluoride (PVDF) as the positive electrode binder. Herein, the mass ratio of the positive electrode active material, the positive electrode conductive agent, and the positive electrode binder is as follows; positive electrode active material:positive electrode conductive agent:positive electrode binder agent=91:6:3.

The negative electrode active material layer contains natural graphite as the negative electrode active material, styrene-butadiene rubber as the negative electrode binder, and carboxymethylcellulose as the negative electrode thickening agent. Herein, the mass ratio of the negative electrode active material, the negative electrode binder, and the negative electrode thickening agent is as follows; negative electrode active material:negative electrode binder:negative electrode thickening agent=98:1:1.

The separator is a microporous sheet of a three-layer structure in which polypropylene (PP) and polyethylene (PE) are stacked in the order of PP/PE/PP.

The electrolyte solution used here is an electrolyte solution in which $LiPF_6$ as a supporting salt is mixed at a proportion of 1.1 mol/L in a mixed solvent of ethylene carbonate (EC), dimethyl carbonate (DMC), and ethyl methyl carbonate (EMC) in a volume ratio of EC:DMC:EMC=30:40:30.

The battery capacity of the secondary battery prepared here has a discharge capacity of 25 Ah from 4.1 V to 3.0 V. The initial resistance of the secondary battery is 1.53 mΩ.

The cycle condition for charging and discharging at high rate was as follows; the battery was repeatedly charged and discharged at a constant current from 90% SOC to 10% SOC in a temperature environment at 25° C. Here, the current rate during discharging was set at 3 C, and the current rate during charging was set at 2 C. The resistance was measured as needed during cycling to check changes in the resistance. The cycling was stopped at the time when the initial resistance of the secondary battery increased to 1.92 mΩ, and the battery was adjusted to a predetermined SOC and thereafter left to stand in a temperature environment at 25° C. Then, the resistance was checked as needed during the time in which the battery was left to stand. Here, the resistance is measured as I-V resistance at 25° C., 60% SOC, 200 A, and 10-second discharge. The adjustment to 60% SOC was carried out in the following manner. For example, in a temperature environment at 25° C., the battery was constant-current charged to a predetermined voltage corresponding to 60% SOC at a current rate of 1C, and thereafter constant-voltage charged at a predetermined voltage corresponding to 60% SOC for 1 hour.

According to FIG. 2, the initial resistance at the start of the measurement was 1.92 mΩ for both cases. As indicated by graph A, when the secondary battery is adjusted to a high SOC (85% SOC herein) and thereafter left to stand, the resistance value of the secondary battery decreases by only about 0.2 mΩ even after 50 hours later. The resistance value gradually decreases further, so it is believed that the resistance value decreases still further as time goes by further. In contrast, as indicated by graph B, when the secondary battery is adjusted to a low SOC (5% SOC herein) and thereafter left to stand, the resistance value decreases by about 0.25 mΩ for about the first 10 hours, thereafter decreases further to about 1.55 mΩ at about 25 hours later, at which the resistance value stabilizes.

Thus, when the battery is adjusted to a low SOC and thereafter left to stand, the rate at which the resistance decreases is higher, and accordingly the deterioration of the secondary battery 10 or the battery module is restored more quickly. Correspondingly, it becomes easier to judge whether the deterioration of the secondary battery 10 or the battery module can be restored or not. According to the discovery by the present inventor, when the secondary battery 10 or the battery module is adjusted to a low SOC condition of from 0% SOC to 20% SOC, the secondary battery 10 or the battery module is likewise restored quickly. At that time, according to the discovery by the present inventor, the secondary battery 10 or the battery module tends to be restored more quickly when it is left to stand in a high temperature environment to a degree that does not affect battery deterioration. For example, it is desirable to leave the battery to stand in a temperature environment of 25° C. to 60° C.

Figure 3:
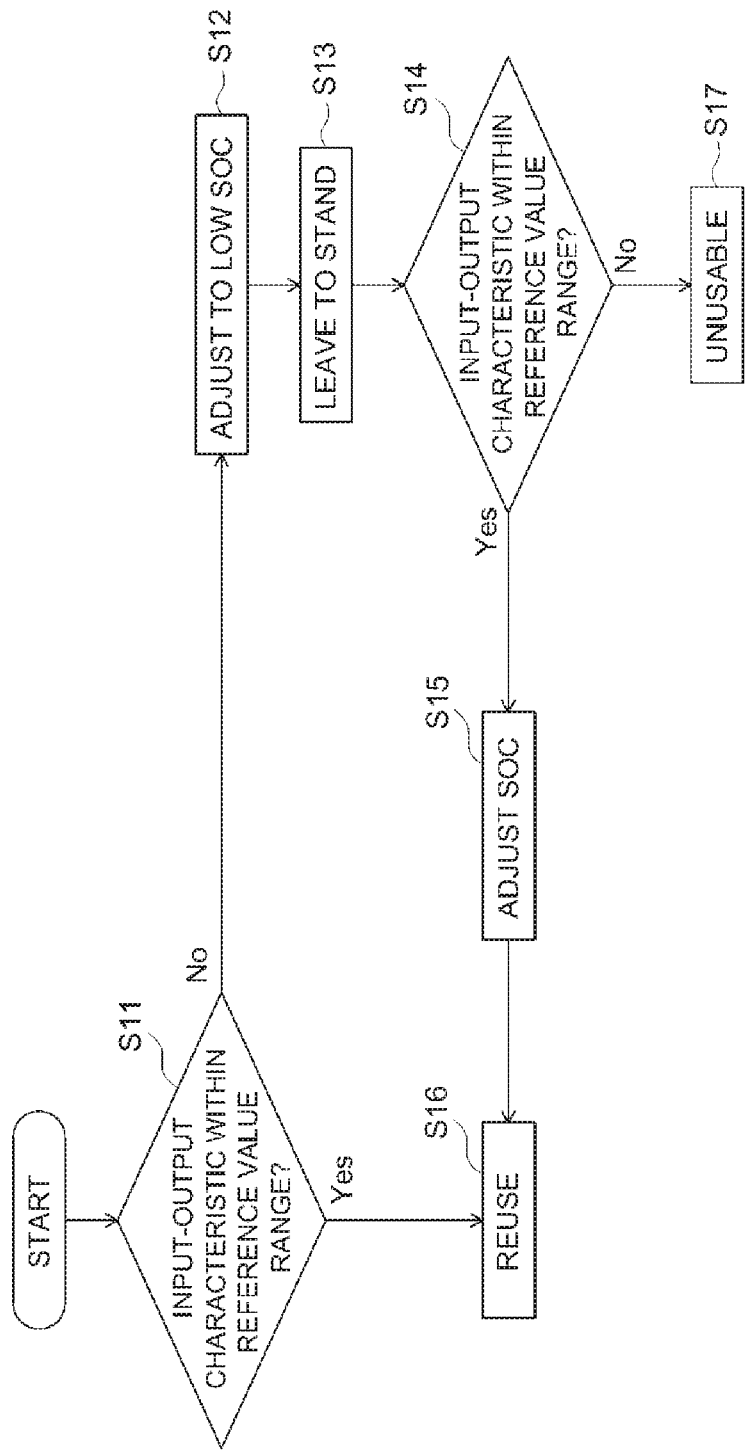
FIG. 3 is a flowchart illustrating one example of a secondary battery restoring method.

A secondary battery restoring method proposed herein includes the following first and second steps. FIG. 3 is a flowchart illustrating one example of a secondary battery restoring method. The secondary battery restoring method proposed herein will be described with reference to FIG. 3 when appropriate. More specifically, the first step is a step (S11) of determining whether or not a value of an input-output characteristic of a secondary battery or a battery module is within a predetermined range of reference values. The second step is a step (S12, S13) of adjusting the secondary battery or the battery module to a predetermined low SOC condition of from 0% to 20% SOC and thereafter leaving the secondary battery or the battery module to stand if, in the first step, the value of the input-output characteristic is determined to be outside the predetermined range of reference values (No).

This restoring method enables a secondary battery or a battery module that has caused high-rate deterioration such as resulting from salt concentration unevenness to be restored more quickly than when the secondary battery or the battery module is not adjusted to a low SOC condition. For example, the resistance value of the secondary battery or the battery module that has caused high-rate deterioration such as resulting from salt concentration unevenness is lowered approximately to the same level as that before the high-rate deterioration occurs, within about ¼ of the time it takes when the secondary battery or the battery module is left to stand without being adjusted to a low SOC condition.

The secondary battery restoring method may also include a third step (S14) of determining whether or not the value of the input-output characteristic of the secondary battery or the battery module that has been left to stand in the second step is within the predetermined range of reference values. Such a third step makes it possible to determine whether the input-output characteristic of the secondary battery or the battery module that was left to stand according to the second step has been restored or not. If, in the first step (S11) or in the third step (S14), the value of the input-output characteristic is determined to be within a predetermined range of reference values, the secondary battery or the battery module should be brought back to a condition in which it is to be reused.

In this case, for example, it is desirable that the secondary battery or the battery module be adjusted (S15) to a predetermined SOC (for example, about 20% to 40% SOC) at which it is usable for normal use. The third step should be carried out, for example, after the secondary battery or the battery module has been left to stand for a predetermined time period according to the second step. It is also possible that, for example, the secondary battery or the battery module be determined to be unusable (S17) if, in the third step (S14), the value of the input-output characteristic is determined to be outside the predetermined range of reference values (No). Although not shown in the drawings, it is also possible that the flow may be returned to the second step if, in the third step (S14), the value of the input-output characteristic is determined to be outside the predetermined range of reference values (No). Then, if, in the third step (S14) after the second step for the second time (or for a predetermined plurality of times), the value of the input-output characteristic is determined to be outside the predetermined range of reference values (No), the secondary battery or the battery module may be determined to be unusable.

In the first step, a value of an input-output characteristic of the secondary battery 10 or the battery module is obtained. The value of the input-output characteristic of the secondary battery 10 or the battery module may be defined as a resistance value, for example. It is desirable that the resistance value be a resistance value that is obtained when the secondary battery 10 or the battery module is adjusted to a predetermined SOC at a predetermined temperature and is discharged at a predetermined constant current value for a predetermined time. The acronym "SOC" stands for state of charge, which means the state of charge of the secondary battery. SOC can be represented by a value that indicates the state of charge of the secondary battery. Herein, the quantity of electricity that is charged in a battery from a predetermined lower limit voltage to a predetermined upper limit voltage with CCCV charging is defined as 100, and the state of charge at the lower limit voltage is defined as 0% SOC. SOC is expressed as percentage of the quantity of electricity that is charged in the secondary battery from the lower limit voltage to the upper limit voltage, wherein the state of charge at the upper limit voltage is defined as 100% SOC.

In this embodiment, in a temperature environment at 25° C., the state at an open circuit voltage of 3.0 V is defined as 0% SOC and the state at an open circuit voltage of 4.1 V is defined as 100% SOC. The lower limit voltage and the upper limit voltage can be determined according to the design of the secondary battery. For example, it is also possible that, in a temperature environment at 25° C., the state at an open circuit voltage of 3.0 V is defined as 0% SOC and the state at an open circuit voltage of 4.2 V is defined as 100% SOC.

According to the discovery by the present inventor, when the secondary battery 10 is adjusted to about 45% to 70% SOC at so-called room temperature, at about 20° C. to 25° C., for example, the I-V resistance of the secondary battery 10 is likely to show a clear difference between a deteriorated state and a non-deteriorated state. To measure the I-V resistance of the secondary battery 10, the secondary battery 10 or the battery module should be adjusted to a condition in which a clear difference in the I-V resistance is likely to arise between a deteriorated state and a non-deteriorated state, and the I-V resistance should be measured under a predetermined discharge condition. Taking these into consideration, it is desirable that the resistance value employed herein be an I-V resistance that is obtained when the secondary battery 10 or the battery module is adjusted to a predetermined SOC at a predetermined temperature and discharged at a predetermined constant current value for a predetermined time. Herein, an I-V resistance that is obtained when an exemplary lithium-ion secondary battery with a battery capacity of 25 Ah is adjusted to 60% SOC at 25° C. and is discharged at 200 A for 10 seconds is employed as the resistance value. Here, the measurement conditions in measuring the I-V resistance, such as target SOC, current value of the discharge current, and discharge duration, may be varied as appropriate depending on the design of the secondary battery or the battery module that is to be tested.

When testing a battery module, it is possible to evaluate the value of the input-output characteristic for the battery module as a whole, or the value of the input-output characteristic for each of a plurality of secondary batteries that constitute the battery module.

The reference value for the value of the input-output characteristic that is determined in the first step may be set to, for example, an appropriate value depending on the intended use of the secondary battery 10 or the battery module. That is, a required level of the input-output characteristic varies depending on the intended use. For example, a battery module that is used for supplying electric power to a vehicle drive motor requires charging and discharging at a considerably high current value so that sufficient vehicle performance and charge performance can be obtained. Accordingly, for such use applications, the reference value for the input-output characteristic needs to be set high. For the use application of supplying electric power to a vehicle drive motor, the performance required for the battery module may vary depending of the type of vehicle. When the value of the input-output characteristic is evaluated by I-V resistance as described above, the resistance needs to be low.

Another example of the reference value for the input-output characteristic may be to what degree the value of the input-output characteristic has deteriorated with respect to the initial value of the input-output characteristic. For example, when the input-output characteristic is represented by I-V resistance, the reference value may be set to a resistance value that is 1.5 times the initial value of the I-V resistance. In this case, in the first step, it is determined whether the I-V resistance has become about 1.5 times or not. When a battery module is evaluated by a value of the input-output characteristic of the battery module as a whole, it is desirable to prepare an appropriate reference value corresponding to the battery module as a whole. When each of a plurality of secondary batteries that constitute a battery module is evaluated by a value of the input-output characteristic of each of the respective batteries, it is desirable to prepare an appropriate reference value corresponding to each of the secondary batteries that constitute the battery module.

When a secondary battery 10 or a battery module that has been used for a vehicle application is to be reused as a battery for an electricity storage system after this test process, it is desirable to set the reference value based on the input-output characteristic required for the battery for the electricity storage system. In this way, the reference value of the input-output characteristic used in the first step and the third step should desirably be, for example, a reference value that corresponds to the intended use application for which the secondary battery 10 or the battery module is to be reused.

Next, an embodiment of the secondary battery reusing method proposed herein will be described below.

Figure 4:
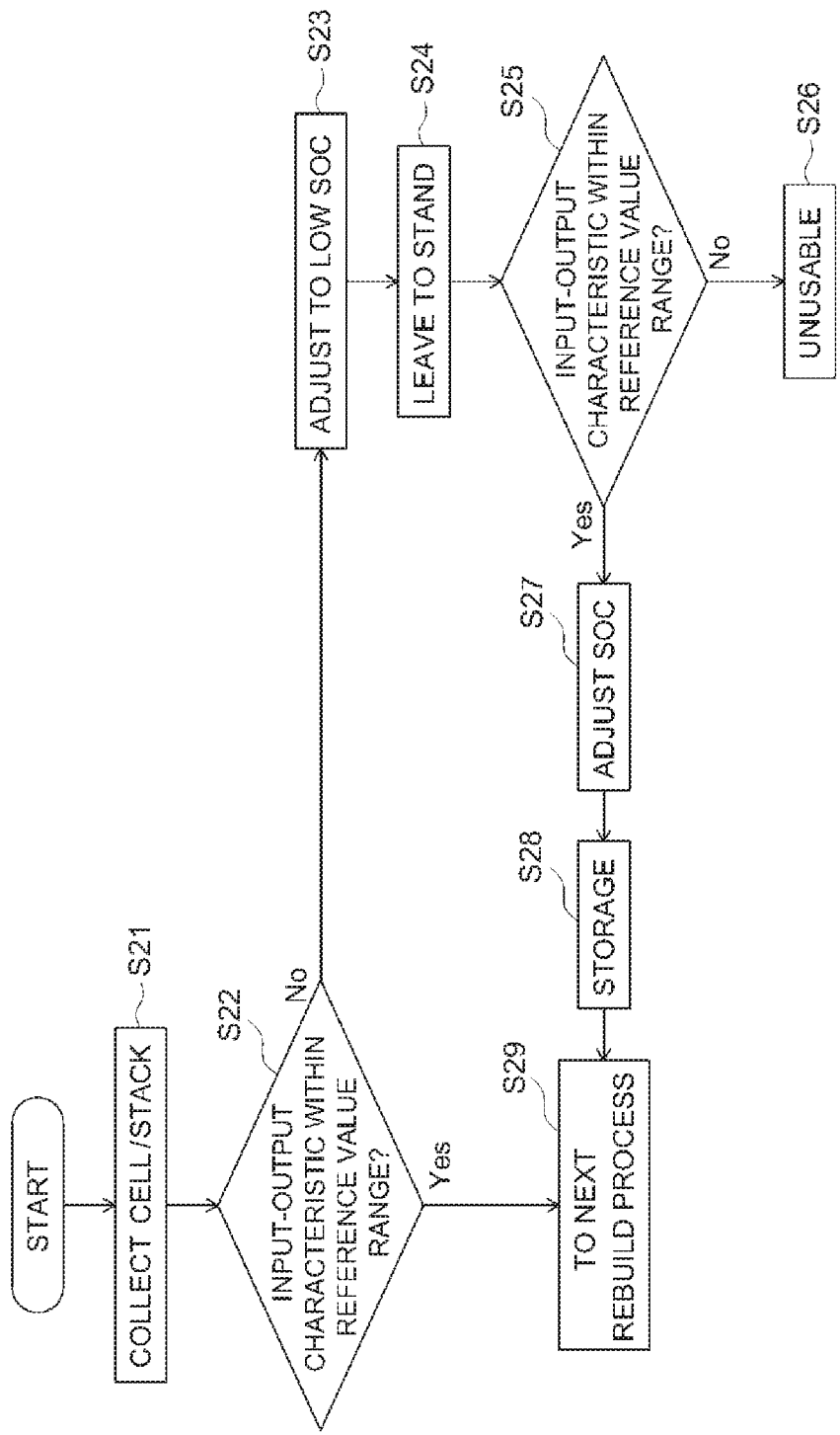
FIG. 4 is a flowchart illustrating one example of a secondary battery reusing method.

An embodiment of the secondary battery reusing method proposed herein typically includes a first step, a second step, a third step, a fourth step, a fifth step, and a sixth step as described below. The secondary battery that is the test subject in this reusing method may be either in a state of single cell battery or in a state of battery module. It is also possible to test each of the secondary batteries that constitute a battery module. FIG. 4 is a flowchart illustrating one example of a secondary battery reusing method. The secondary battery restoring method proposed herein will be described with reference to FIG. 4 when appropriate.

The first step is a step of determining whether or not a value of an input-output characteristic of a secondary battery 10 or a battery module is within a predetermined range of reference values. As illustrated in FIG. 4, for example, the secondary battery 10 or the battery module that has been actually used in such a use application in which charging and discharging are repeated at high rate is collected (S21). Then, subsequently, it is determined whether or not a value of an input-output characteristic of the secondary battery 10 or the battery module is within a predetermined range of reference values (S22). In this embodiment, the value of the input-output characteristic of the secondary battery 10 or the battery module is a resistance value that has been measured by a predetermined measurement method. The phrase "the value of the input-output characteristic is within a predetermined range of reference values" means that the measured reference value is equal to or less than a predetermined threshold value that has been set in advance as the reference value. On the other hand, the phrase "the value of the input-output characteristic is outside a predetermined range of reference values" means that the measured resistance value is greater than a predetermined threshold value that has been set in advance as the reference value. That is, in the determination step S22 herein, the resistance value of the secondary battery 10 or the battery module is measured, and it is determined whether or not the measured resistance value is equal to or less than a predetermined threshold value.

The second step is a step of adjusting the secondary battery 10 or the battery module to a predetermined low SOC condition of from 0% to 20% SOC and thereafter leaving the secondary battery 10 or the battery to stand for a predetermined time period if, in the first step, the value of the input-output characteristic is determined to be outside the predetermined range of reference values (No). In this case, if the deterioration of the secondary battery 10 or the battery module is one that can restored, the resistance decreases quickly. For this reason, it is desirable to measure the I-V resistance after the secondary battery 10 or the battery module is left to stand for, for example, about 10 hours to about 24 hours. For example, as illustrated in FIG. 4, if the value of the input-output characteristic is determined to be outside the predetermined range of reference values (No) in the determination step S22, which corresponds to the first step, the secondary battery 10 or the battery module is adjusted to a low SOC (S23). For example, if the resistance value as the value of the input-output characteristic is greater than a threshold value that is set as a resistance value, the secondary battery 10 or the battery module is adjusted to a low SOC. Then, the secondary battery 10 or the battery module should be left to stand for a predetermined time period in that condition, for example, managed and stored in a predetermined temperature condition (S24).

In use applications such that the battery is repeatedly charged and discharged at high rate, such as in vehicle applications, the charge and discharge process is controlled so that the battery is used in a predetermined SOC range, for example, about 30% to about 70% SOC. In such applications, the battery is not used in a low SOC range, such as in a range of 0% to 20% SOC (for example, at about 10% SOC) during its use. The reason is that if the battery is repeatedly charged and discharged at high rate in such a low SOC range such as 0% to 20% SOC, there is a tendency that a burden on the active material is so great that the deterioration can occur easily. For example, for vehicle applications, the secondary battery 10 or the battery module is controlled so that the secondary battery 10 or the battery module does not fall into a predetermined low SOC condition of 0% to 20% SOC in a normal control operation for moving a vehicle. Moreover, the secondary battery 10 or the battery module is not stored for a long period of time with the secondary battery 10 or the battery module being adjusted to a predetermined low SOC condition of 0% to 20% SOC. Such a second step can be carried out, for example, while the vehicle is at standstill, or while the secondary battery 10 or the battery module is removed therefrom.

According to the discovery by the present inventor, the secondary battery 10 or the battery module is restored more easily when the secondary battery 10 or the battery module is adjusted and stored in a predetermined low SOC condition of from 0% to 20% SOC, as described previously. Moreover, the restoration takes place more quickly when the secondary battery 10 or the battery module is left to stand in a high temperature environment to a degree that does not affect battery deterioration, in addition to storing it in a low SOC condition. For example, it is desirable to leave the battery to stand in a temperature environment at 25° C. to 60° C.

In the second step, the secondary battery 10 or the battery module is adjusted to a predetermined low SOC condition of from 0% to 20% SOC and thereafter left to stand for a predetermined time period. Here, the time period for which the secondary battery or the battery module is left to stand should be set to a sufficient time it is expected to take to restore the input-output characteristic (resistance herein) sufficiently. Such a time period may be set to about 10 hours to about 50 hours, for example, more specifically, about 20 hours, about 24 hours, or about 30 hours, although it may depend on the design of the battery. In the second step, it is desirable that the secondary battery 10 or the battery module be adjusted to a lower SOC to a degree that does not affect the battery deterioration, for example, to about 0% to 10% SOC (for example, about 2% to 6% SOC).

The third step is a step of, subsequent to the second step, determining whether or not the value of the input-output characteristic is within the predetermined range of reference values. In other words, in the third step, it is determined whether or not the input-output characteristic of the secondary battery 10 or the battery module that has been adjusted to a predetermined low SOC condition of 0% to 20% SOC and thereafter left to stand for a predetermined time period in the second step is within the predetermined range of reference values.

An example of the third step is as follows. As illustrated in FIG. 4, for example, the input-output characteristic (the I-V resistance herein) of the secondary battery 10 or the battery module is measured after the step S24 of leaving the secondary battery 10 or the battery module to stand for a predetermined time period. Then, it is determined whether or not the value of the input-output characteristic is within a predetermined range of reference values (threshold values) (S25). In such a determination step S25, if the input-output characteristic of the secondary battery 10 or the battery module is determined to be within the predetermined range of reference values (Yes), the process determines that the secondary battery 10 or the battery module has been restored to a condition in which the secondary battery 10 or the battery module can exhibit a required input-output characteristic.

The fourth step is a step of determining the secondary battery 10 or the battery module to be unusable if, in the third step, the value of the input-output characteristic of the secondary battery 10 or the battery module is determined to be outside the predetermined range of reference values.

This corresponds to the case in which the input-output characteristic of the secondary battery 10 or the battery module is determined to be outside the predetermined range of reference values (No) in the determination step S25 as shown in FIG. 4, for example. In this case, it is determined that the secondary battery 10 or the battery module will not be restored to a condition in which the secondary battery 10 or the battery module can exhibit a required input-output characteristic, and the secondary battery 10 or the battery module is determined to be unusable (S26). That is, when leaving the secondary battery 10 or the battery module to stand for a predetermined time period in a low SOC condition cannot decrease the resistance thereof and cannot restore the secondary battery 10 or the battery module to a condition in which it can exhibit a required input-output characteristic, the process determines that the secondary battery 10 or the battery module is in a condition not suited for use.

The fifth step is a step of determining the secondary battery 10 or the battery module to be usable if, in the first step or in the third step, the value of the input-output characteristic of the secondary battery 10 or the battery module is determined to be within the predetermined range of reference values.

This corresponds to the case in which the input-output characteristic of the secondary battery 10 or the battery module is determined to be within the predetermined range of reference values (Yes) in the determination step S25 as shown in FIG. 4, for example. In this case, it is determined that the secondary battery 10 or the battery module has been restored to a condition in which the secondary battery 10 or the battery module can exhibit a required input-output characteristic, and the secondary battery 10 or the battery is determined to be usable. That is, when leaving the secondary battery 10 or the battery module to stand for a predetermined time period in a low SOC condition has decreased the resistance and restored the secondary battery 10 or the battery module to a condition in which it can exhibit a required input-output characteristic, the process determines that the secondary battery 10 or the battery module is in a condition suited for use.

The sixth step is a step that is carried out if, in the third step, the value of the input-output characteristic is determined to be within the predetermined range of reference values. It is desirable that the secondary battery 10 or the battery module be adjusted to a predetermined SOC (S27) if the input-output characteristic of the secondary battery 10 or the battery module is determined to be within the predetermined range of reference values (Yes) in the determination step S25 as shown in FIG. 4, for example. That is, after the third step, the secondary battery 10 or the battery module has been adjusted to a low SOC condition, or the secondary battery 10 or the battery module has been charged and discharged for measuring the input-output characteristic after it was stored for a predetermined time period in a low SOC condition. For this reason, it is desirable that after the third step, the secondary battery 10 or the battery module be adjusted to an appropriate SOC suited for reuse. For example, for vehicle applications, it is desirable that the secondary battery 10 or the battery module be adjusted to about 20% SOC. Because the secondary battery 10 or the battery module is adjusted to about 20% SOC, the secondary battery 10 or the battery module can be started after installation in the vehicle, and thereafter, it is charged according to a predetermined control process. Thus, the secondary battery 10 or the battery module should desirably be adjusted to an appropriate SOC suited for reuse, and after having been adjusted to an appropriate SOC suited for reuse, the secondary battery 10 or the battery module should desirably be stored in an appropriate condition until it is actually reused. The storage condition here may be, for example, such that the secondary battery 10 or the battery module is stored in a cool and dark place at a predetermined controlled temperature, to maintain the performance of the secondary battery 10 or the battery module.

As illustrated in FIG. 4, if the secondary battery 10 or the battery module is determined to be usable in the determination step S22, which corresponds to the first step, or in the determination step S25, which corresponds to the third step, the process moves to a reuse step (S29). Thus, in the reusing method illustrated herein, once the input-output characteristic of the secondary battery 10 or the battery module is determined to be outside a predetermined range of reference values, the secondary battery 10 or the battery module is left to stand for a predetermined time period in a low SOC condition. This process makes it possible to quickly determine whether the secondary battery 10 or the battery module is reusable. This serves to reduce the time and costs required for the test.

Although various embodiments of the secondary battery restoring method and the secondary battery reusing method proposed herein have been described above, the embodiments and examples described herein do not limit the present invention unless otherwise stated.

For example, the secondary battery restoring method and the secondary battery reusing method herein are also applicable to battery modules including a plurality of secondary batteries. The battery module may be used in a state in which a plurality of secondary batteries are assembled, or may be disassembled into single battery cells and used in a state of single battery cell. It is also possible that, in the second step, the battery module may be in an assembled state when adjusting it to a low SOC condition but the battery module may be disassembled into a plurality of single battery cells when leaving it to stand. Thus, in the case of battery module, the battery module containing a plurality of secondary batteries may be disassembled into single battery cells in the middle of each of the steps, or before or after each of the steps. The flowcharts of FIGS. 3 and 4 are merely examples, and the secondary battery restoring method and the secondary battery reusing method proposed herein are not limited to the examples shown in FIGS. 3 and 4. The restoring method and the reusing method for secondary batteries are especially suitable as a restoring method and a reusing method for secondary batteries or battery modules used in applications that accompany high-rate deterioration. Examples of the applications that accompany high-rate deterioration include vehicle applications, but the invention is not limited to vehicle applications but may be applicable to various other applications.

What is claimed is:

1. A secondary battery restoring method comprising:
a first step of determining an I-V resistance value of a secondary battery or a battery module is within a predetermined range of reference I-V resistance values;
the first step comprising adjusting the secondary battery or the battery module to 45% to 70% SOC, then discharging the secondary battery or the battery module at a predetermined constant current value for a predetermined time, and then measuring the I-V resistance value of the secondary battery or the battery module and determining if it is within the predetermined range of the reference I-V resistance values;
a second step of adjusting the secondary battery or the battery module to a predetermined low SOC condition of from 0% to 20% SOC and thereafter leaving the secondary battery or the battery module to stand if, in the first step, the I-V resistance value was determined to be outside the predetermined range of reference I-V resistance values; and
a third step of determining, subsequent to the second step, whether the I-V resistance value of the secondary battery or the battery module is within the predetermined range of reference I-V resistance values;
the third step comprising adjusting the secondary battery or the battery module to 45% to 70% SOC, then discharging the secondary battery or the battery module at a second predetermined constant current value for a second predetermined time, and then measuring the I-V resistance value of the secondary battery or the battery module and determining if it is within the predetermined range of the reference I-V resistance values.

2. A secondary battery reusing method comprising:

a first step of determining an I-V resistance value of a secondary battery or a battery module is within a predetermined range of reference I-V resistance values;

the first step comprising adjusting the secondary battery or the battery module to 45% to 70% SOC, then discharging the secondary battery or the battery module at a predetermined constant current value for a predetermined time, and then measuring the I-V resistance value of the secondary battery or the battery module and determining if it is within the predetermined range of the reference I-V resistance values;

a second step of adjusting the secondary battery or the battery module to a predetermined low SOC condition of from 0% to 20% SOC and thereafter leaving the secondary battery or the battery module to stand for a predetermined time period if, in the first step, the I-V resistance value was determined to be outside the predetermined range of reference I-V resistance values;

a third step of determining, subsequent to the second step, whether the I-V resistance value of the secondary battery or the battery module is within the predetermined range of reference I-V resistance values;

the third step comprising adjusting the secondary battery or the battery module to 45% to 70% SOC, then discharging the secondary battery or the battery module at a second predetermined constant current value for a second predetermined time, and then measuring the I-V resistance value of the secondary battery or the battery module and determining if it is within the predetermined range of the reference I-V resistance values;

a fourth step of determining the secondary battery or the battery module to be unusable if, in the third step, the I-V resistance value was determined to be outside the predetermined range of reference I-V resistance values; and a fifth step of determining that the secondary battery or the battery module is usable if, in the first step or in the third step, the I-V resistance value was determined to be within the predetermined range of reference I-V resistance values.

3. The secondary battery reusing method according to claim 2, further comprising a sixth step of adjusting the secondary battery or the battery module to a predetermined SOC if, in the third step, the I-V resistance value was determined to be within the predetermined range of reference I-V resistance values.

* * * * *